United States Patent [19]

Andros et al.

[11] 4,313,492

[45] Feb. 2, 1982

[54] MICRO HELIX THERMO CAPSULE

[75] Inventors: Frank E. Andros, Binghamton, N.Y.;
Robert J. E. Shay, Salisbury, N.C.

[73] Assignee: International Business Machines Corporation, Armonk, N.Y.

[21] Appl. No.: 105,677

[22] Filed: Dec. 20, 1979

[51] Int. Cl.³ ............................................. F28D 15/00
[52] U.S. Cl. .......................... 165/104.26; 165/104.33; 357/82
[58] Field of Search .............. 165/105, 104.26, 104.33; 357/82

[56] References Cited

U.S. PATENT DOCUMENTS

| | | | |
|---|---|---|---|
| 3,450,195 | 6/1969 | Schnacke | 165/105 X |
| 3,734,173 | 5/1973 | Moritz | 165/105 |
| 3,762,011 | 10/1973 | Staudhammer et al. | 165/105 X |
| 3,978,518 | 8/1976 | Kessler, Jr. et al. | 165/105 X |

FOREIGN PATENT DOCUMENTS 785461 10/1957 United Kingdom ................. 357/82

*Primary Examiner*—Albert W. Davis
*Attorney, Agent, or Firm*—Paul M. Brannen

[57] ABSTRACT

A closed two phase liquid-vapor heat transfer device is provided which is independent of orientation and requires no wick. A micro helix containment vessel contains liquid to form a coolant vapor phase. Heat input at the evaporator section results in evaporation of the liquid at the liquid-vapor interface. The vapor flows through the bellow and condenses on the opposite end where heat is rejected and liquid is replenished to the evaporator section by flow through capillary passages of helical form in the corrugations of the bellows.

6 Claims, 3 Drawing Figures

MICRO HELIX THERMO CAPSULE

BACKGROUND OF THE INVENTION

In the present day integrated circuit technology, metallized ceramic modules are provided which are pluggable into printed circuit cards and boards. These modules take the form of a ceramic substrate base having a printed circuit pattern on a surface thereof to which is solder bonded one or more silicon chips. A module cap or cover is employed to provide a hermetic seal. These chips have embedded therein circuits, such as memory driver and sense circuits, operational amplifiers and support logic for these circuits. The circuit chips perform the special electronic functions for the machines they are used with and the chips produce large quantities of heat during their operation. The problem of adequately dissipating this heat is of major concern.

It has been well known to provide heat transfer means or heat sinks for integrated circuit modules. Such means have taken the form, for example, of piston contact between the chip device and a suitable cold plate; the use of cooling fins; the use of an air stream or conductors of liquid coolant; and filling the gap between the chip device and the module cap with a thermal grease or conductive powder or liquid metal.

The aforementioned heat transfer means usually occupy a large amount of space and employ rather critical material. Also, they are relatively expensive to manufacture and are large and heavy in use.

More recently, two relatively new techniques have been involved in the cooling of circuit elements which employ the principles of a thermosiphon and a heat pipe. In the thermosiphon, a container is provided with liquid coolant in an evaporator section and heat input to this section results in vapor which condenses in a condenser section where heat is rejected. The siphon relies on external forces, such as gravity, to return the condensate vertically along the side walls to the evaporator section. As a result, the thermosiphon is a unidirectional heat transfer device (a thermal diode) limited by orientation. The heat pipe also employs a container having liquid coolant in an evaporator section and heat input to this section results in the formation of vapor which condenses in a condenser section where heat is rejected. The heat pipe uses the capillary forces of an internal wick structure to recirculate condensate to the evaporator section. The heat pipe is a relatively expensive heat transfer device due to the cost of the internal wick structure and this is particularly true where a flexible bellows type container is used. A flexible bellows type heat transfer device is preferred for integrated circuit module applications because it provides a secondary flexible heat transfer path which will minimize the force exerted on the chip and solder joints which arise due to tolerance buildup on the chip, substrate, and cap assembly. It became evident that the desirable heat transfer device would be one of the bellows type which would be independent of external forces and which does not require an additional internal wick structure for continuous operation.

SUMMARY OF THE INVENTION

The present invention provides a micro helix thermo capsule which is unique in that its continuous operation is independent of external forces and no additional wicking mechanism is required for continuous operation. This is accomplished by utilizing capillary passage(s) in the convolutions of the bellows to form a helical passageway(s) to provide a continuous liquid circulation path between the source of heat and the point of heat rejection, and which is independent of orientation with respect to gravity.

Heat input at the evaporator section of the capsule or bellows results in nucleate boiling or evaporation of the liquid at the liquid-vapor interface. The vapor flows through the bellows and condenses on the opposite side where heat is rejected and liquid is replenished to the evaporator section by flow through the capillary helical passages in the bellows convolutions. Variations in the equilibrium operating condition of the device can be obtained by selecting the appropriate working fluid. Since the device contains only the liquid and its vapor in equilibrium, the operating pressure will be determined by the vapor pressure temperature relationship of the selected fluid. Therefore, fluids with relatively flat vapor pressure temperature characteristics are desirable for those applications where minimum changes in pressure are desirable and vice versa.

The self-containment characteristics of the micro helix thermo capsule permits its application where direct contact with a working fluid is not permissible and it provides a highly efficient heat transfer device which takes advantage of the enthalpy of vaporization/condensation. Significant amounts of heat can be released or absorbed at high heat rates without appreciable differences in temperature. The capsule can be applied to many technologies, such as cooling electronic components, isothermal electronic switches and deicing of micro miniature structures.

Another advantage of the micro helix thermo capsule is that its design permits one continuous operating regime independent of working pressure, temperature, and external forces over a wide range of these conditions. The operating regime, namely, the continuous liquid circulation path, is stable and therefore provides one mode of liquid recirculation.

Accordingly, a primary object of the present invention is to provide a novel and improved heat transfer device which comprises a micro helix thermo capsule.

Another object of the present invention is to provide a novel and improved heat transfer device comprising a micro helix thermo capsule which will operate independent of orientation and requires no additional wicking structure.

A further object of the present invention is to provide a micro helix thermo capsule heat transfer device which permits one continuous operating regime independent of working pressure, temperature, and external forces over a wide range of these conditions.

Still another object of the present invention is to provide a novel and improved micro helix thermo capsule for use in cooling integrated circuit modules.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
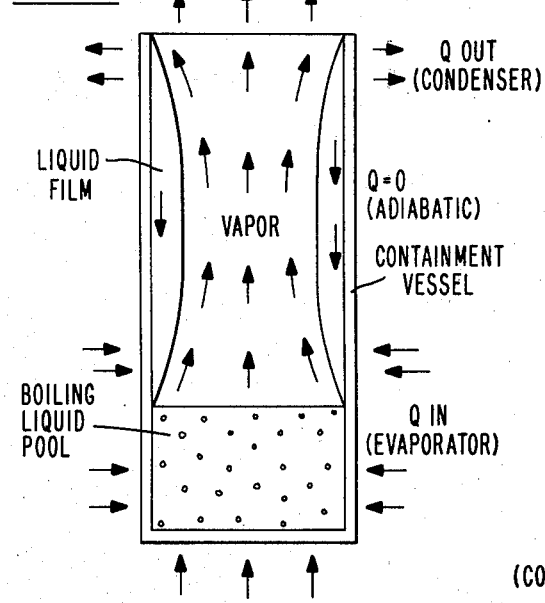
FIG. 1 illustrates the operation of the prior art thermosiphon heat transfer device.
Figure 2:
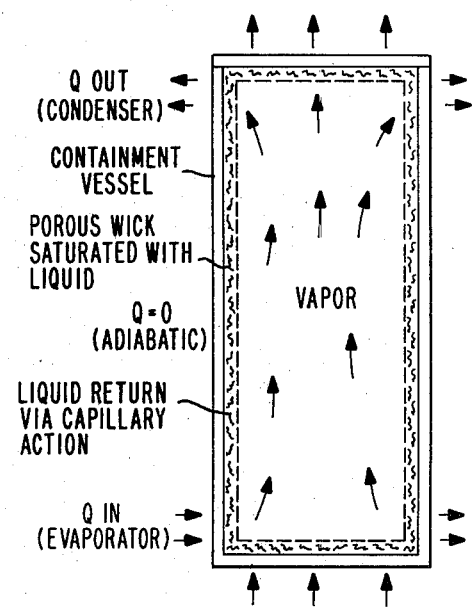
FIG. 2 illustrates the operation of the prior art heat pipe heat transfer device.

Referring first to FIGS. 1 and 2, there is illustrated two recent prior art techniques which have been involved in the cooling of electronic circuit elements. FIG. 1 shows a thermosiphon wherein a sealed containment vessel is provided with a liquid pool in an evaporator section and heat input to this section boils the liquid resulting in vapor which condenses in a condenser section where heat is rejected. The siphon relies on external forces, such as gravity, to return the condensate as a liquid film vertically along the side walls to the evaporator section. FIG. 2 illustrates the conventional heat pipe which also employs a sealed containment vessel having a liquid saturated wick structure and heat input to an evaporator section results in surface evaporation from the wick structure and vapor condenses in a condenser section where heat is rejected. The heat pipe uses the capillary forces of the porous wick structure to recirculate condensate to the evaporator section.

Figure 3:
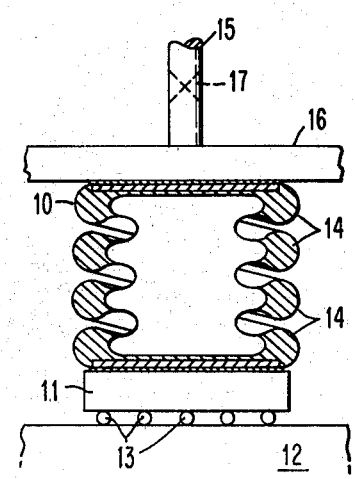
FIG. 3 illustrates the application of the present invention as a micro helix thermo capsule for cooling an electronic device.

FIG. 3 illustrates the manner in which a micro helix thermal capsule can be used for internal thermal enhancement of metallized ceramic and multilayer ceramic modules which contain at least one integrated circuit chip which is attached to the ceramic substrate by the use of solder joints. Conventional modules which are not provided with thermal enhancement are cooled by conducting heat from the chip, through the solder joints and into the substrate, module cap, input/output pins, and the printed circuit card or board into which the module is plugged. A common internal enhancement technique provides a parallel path directly from the chip to the module cover, thus increasing the power dissipation capability of the component. A prerequisite for this type of enhancement is that the secondary path must be flexible in order to minimize the force exerted on the chip and solder joints which arises due to tolerance buildup on the chip, substrate, and cap assembly, or due to thermal expansion during operation of the module.

Referring to FIG. 3, there is illustrated the micro helix capsule concept of the present invention incorporated into a micro helix capsule 10 which is particularly adapted for use in the cooling of an integrated circuit chip 11 which is attached to the substrate 12 of a module by way of solder joints 13. The micro helix capsule or container 10 enables the absorption of stresses in the system during operation and provides a metallurgical bond to the device and cap which is independent of the tolerances of the total system. Also, the high heat transfer rates normally associated with evaporation and condensation processes is by this means inserted within the structure of the module. The micro helix by its construction provides a hermetic environment which prevents leakage of coolant or the entry of contamination which preserves the desired equilibrium conditions. The capsule can also be bonded by a metallic interface of solder to a solderable surface on the inside of the module cap and on the backside of the chip. Since the backside of the chip can be passivated, no electrical continuity with the cap is made and an excellent thermal joint can be attained.

As shown, the bellows capsule 10 is preferably cylindrical with a cylindrical containment interior and is preferably constructed with a filling tube 15 at one end which may be made of a soft material, such as copper, and which is used to insert the liquid coolant after module assembly as seen in FIG. 3. In the bonding and assembly of the micro bellows capsule into the module, a solderable metal, such as gold, is evaporated on the backside of the chip 11 during fabrication of the wafer from which the chip is diced. A passivation layer of silicon oxide is incorporated before the metal evaporation to assure electrical isolation.

The micro helix capsule is constructed of a solderable metal, such as nickel or copper, and the inside of the module cap 16 can be electroless/electrolytically deposited with copper. A solder bond or gold-tin eutectic is then utilized to join the bellows capsule between the inside of the cap and the backside of the chip. Joining is done in a chip joining furnace similar to those used in the conventional chip joining technology.

Preferably, as shown in FIG. 3, the nominal length of the bellows is approximately equal to its internal diameter.

After assembly, a hypodermic syringe can be used to completely fill the bellows capsule container with a liquid coolant via filler tube 15. Heat is then applied to the device such that the fluid temperature is raised to 10° F. below its boiling point allowing the coolant to evaporate out the open filler tube until the desired quantity of coolant remains, substantially equal to, as a minimum, the quantity needed to fill the convolution of the helix.

Now the filler tube 15 is sealed by compression, such as crimping, as indicated at 17. Thus, at this point the bellows capsule is closed.

Now when the module is put into operation, heat from the circuit chip 11 will cause the liquid coolant in the lower or evaporator section of the capsule to evaporate. Vapor flows through the chamber and condenses in a condenser section on the other end where heat is rejected. Liquid is replenished to the evaporator section by condensate return flow through the continuous liquid film including the capillary passages 14. A suitable heat sink may be attached to the top of the module cap. The heat sink may comprise water, air flow, thermal grease, or the like.

In operation of the module, the circuit chip heat dissipation occurs at junctions within the chip. In present day technology, as the junction temperature increases the chip life will be degraded. In using the present micro helix capsule, by selecting the appropriate coolant vaporpressure-temperature characteristics and fill quantity, the junction temperature can be regulated well below present day operating temperatures to give the minimum solder joint-to-substrate expansion excursion which in turn enhances the life of the solder joints. Also, by selecting the operating pressure, the solder joints can by design be placed in tension or compression which is also considered a means of enhancing solder joint life.

With the present capsule application, the composition of the container permits a soldered or eutectic metallurgical bond to both the cap and chip of approximately 0.002 inch thickness, for example, which results in a very low thermal resistance joint. Assuming a 0.002 inch solder thickness for the bond from the chip to the thermo capsule and from the thermo capsule to the module cap and that the thermo capsule containment vessel has 0.015" thick copper ends, an order of magnitude reduction in internal thermal resistance, $R_{Int}$ (degrees Centigrade per watt) is possible with reference to a standard metallized ceramic product, which has no thermal enhancement; and that a four-fold reduction is possible with reference to a module utilizing thermal grease for thermal enhancement with 0.350" chip size.

The micro helix thermo capsule concept can be introduced to current module technologies with minimal or no impact to module design and the bonding operation is accomplished by using conventional process technology. If necessary, convenient rework is permitted. By heating in a pressurized nitrogen atmosphere to the bonding temperature, the cap and the micro bellows can be removed.

While the invention has been particularly shown and described with reference to a preferred embodiment thereof, it will be understood by those skilled in the art that various changes in form and details may be made therein without departing from the spirit and scope of the invention.

Having thus described our invention, what we claim as new and desire to secure by letters patent is:

1. A heat transfer device comprising a closed container and a quantity of coolant liquid therein, said container comprising a flexible cylindrical bellows having a helical convolution extending from one end to the other end to provide at least one capillary passage therein joining the inside opposite ends of said container, said capillary passage having an interior cross section selected to provide capillary flow from one end of said container to the other end, one end of said container being juxtaposed to a heat source, and the other end of said container being juxtaposed to a heat sink.

2. A heat transfer device as claimed in claim 1 wherein said liquid is an alcohol.

3. A heat transfer device as claimed in claim 1 wherein said container has a length approximately equal to its internal diameter.

4. A heat transfer device for use in a module having an integrated circuit chip contained within a module cap, which comprises, in combination, a closed micro helix bellows having a cylindrical containment chamber, and at least one helical capillary passage formed by the convolutions of said helix, an evaporator section at one end of said containment chamber and a condenser section at the opposite end, said section being connected for liquid flow by said capillary passage, and a liquid coolant in said evaporator section, whereby application of heat from said chip to said evaporator section results in vapor flow from said evaporator section through said containment chamber to said condenser section where heat is transmitted to said module cap, and coolant liquid condensed in said condenser section is returned to said evaporator section by flow through said capillary passage.

5. A heat transfer device as claimed in claim 4 in which said micro helix bellows is provided with solderable ends for joining to said chip and said module cap.

6. A heat transfer device as claimed in claim 4 in which said liquid coolant comprises an alcohol.

* * * * *